(12) United States Patent
Kinugawa

(10) Patent No.: US 9,508,580 B2
(45) Date of Patent: Nov. 29, 2016

(54) TRANSPORT DEVICE

(71) Applicant: Daifuku Co., Ltd., Osaka-shi (JP)

(72) Inventor: Tomotaka Kinugawa, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 161 days.

(21) Appl. No.: 14/471,203

(22) Filed: Aug. 28, 2014

(65) Prior Publication Data

US 2015/0063963 A1    Mar. 5, 2015

(30) Foreign Application Priority Data

Aug. 30, 2013  (JP) ................................ 2013-180101

(51) Int. Cl.
| | | |
|---|---|---|
| H01L 21/677 | (2006.01) | |
| B25J 15/00 | (2006.01) | |
| B65G 47/90 | (2006.01) | |
| B66C 1/66 | (2006.01) | |

(52) U.S. Cl.
CPC ...... *H01L 21/67733* (2013.01); *B25J 15/0052* (2013.01); *B65G 47/907* (2013.01); *B66C 1/663* (2013.01)

(58) Field of Classification Search
CPC .......................... B25J 15/0052; B65G 47/907
USPC ............... 294/2, 87.22, 87.24; 414/623, 736, 414/749.4, 749.5
See application file for complete search history.

(56) References Cited

U.S. PATENT DOCUMENTS

| | | | | |
|---|---|---|---|---|
| 3,029,100 A | * | 4/1962 | Laine ...................... | B66C 1/485 294/106 |
| 3,762,586 A | * | 10/1973 | Updike, Jr. ............... | B65F 3/04 294/104 |
| 4,682,931 A | * | 7/1987 | House ..................... | B66F 9/184 294/206 |
| 5,054,836 A | * | 10/1991 | Schulz .................. | B25J 15/0206 294/116 |
| 5,263,813 A | * | 11/1993 | Kiederle ................ | B65G 47/90 294/67.31 |
| 5,983,479 A | * | 11/1999 | Sato .................. | H01L 21/68707 29/426.1 |
| 6,213,706 B1 | * | 4/2001 | Christenson ............ | B65F 3/046 414/408 |
| 6,604,770 B1 | * | 8/2003 | Van Geijlswijk ....... | B65B 43/54 294/81.51 |
| 8,061,748 B2 | * | 11/2011 | Kipping .................. | B25B 5/061 294/106 |
| 8,226,140 B1 | * | 7/2012 | Dietrich .................. | B66C 1/107 294/119.1 |
| 2015/0197412 A1 | * | 7/2015 | Tomida ................... | B66C 13/06 212/273 |
| 2015/0255318 A1 | * | 9/2015 | Wada ...................... | B66C 13/18 212/276 |

FOREIGN PATENT DOCUMENTS

JP    2003171081 A    6/2003

* cited by examiner

*Primary Examiner* — James Keenan
(74) *Attorney, Agent, or Firm* — The Webb Law Firm

(57) ABSTRACT

A transport device includes a large-article drive portion that moves each of a pair of large-article supporting portions between a large-article supporting position and a large-article retracted position, and a small-article drive portion that moves each of a pair of small-article supporting portions between a small-article supporting position and a small-article retracted position. The small-article retracted position is set at a height at which the pair of small-article supporting portions are located above a supported portion supported by the pair of large-article supporting portions, and the pair of small-article supporting portions are provided between the pair of large-article supporting portions in a lateral width direction.

5 Claims, 7 Drawing Sheets

TRANSPORT DEVICE

CROSS-REFERENCE TO RELATED APPLICATION

This application claims priority to Japanese Patent Application No. 2013-180101 filed Aug. 30, 2013, the disclosure of which is hereby incorporated in its entirety by reference.

FIELD OF THE INVENTION

The present invention relates to a transport device including a pair of supporting portions that support a supported portion included at an upper end of a transported article on both sides in a lateral width direction of the transported article, a moving body that supports the pair of supporting portions, and a transporting drive portion that moves the moving body.

BACKGROUND

An example of the above-described transport device is disclosed in JP 2003-171081A (Patent Document 1). The transport device of Patent Document 1 is configured to transport articles by moving a moving body, with a supported portion of a transported article being supported by a pair of supporting portions. This transport device is used for transporting a transported article.

SUMMARY OF THE INVENTION

While the transport device according to Patent Document 1 described above is configured to transport a single type of transported articles, a transport device may be required to transport a plurality of types of articles having different capacities.

Specifically, the transport device of Patent Document 1 transports, as the transported articles, FOUPs that accommodate semiconductor wafers. Examples of FOUPs include a FOUP that accommodates semiconductor wafers having a size of 450 mm (hereinafter, an example of a large transported article) and a FOUP that accommodates semiconductor wafers having a size of 300 mm (hereinafter, an example of a small transported article). The transport device may be required to transport these FOUPs having different capacities. Also, the FOUP for 450 mm and the FOUP for 300 mm described above also differ in the width in the lateral width direction (lateral width) of the supported portions due to different capacities.

In the case of transporting a large transported article and a small transported article in this way, the large transported article and the small transported article may have different lateral widths in the supported portion supported by the pair of supporting portions.

Therefore, in the case of transporting the large transported article and the small transported article that include supported portions having different lateral widths, for example, it is conceivable to adopt a configuration that enables the pair of supporting portions to support the large transported article and the small transported article by changing the position of the pair of supporting portions to a retracted position at which the interval between the supporting portions is wider than the lateral width of the supported portion of the large transported article, a large-article supporting position at which the interval corresponds to the lateral width of the supported portion of the large transported article, and a small-article supporting position at which the interval corresponds to the lateral width of the supported portion of the small transported article.

However, in the case of the above-described configuration, the interval between the pair of supporting portions at the large-article supporting position is narrower than the interval between the pair of supporting portions at the retracted position, and the interval between the pair of supporting portions at the small-article supporting position is further narrower than the interval between the pair of supporting portions at the large-article supporting position. Accordingly, the movement distance of the pair of supporting portions from the retracted position to the small-article supporting position is long, and this increases the time required to move the pair of supporting portions from the retracted position to the small-article supporting position. Thus, it requires a long time to perform the operation of switching between support and removal of support for the small transported article.

Therefore, there is a need for a transport device capable of transporting a large transported article and a small transported article, while promptly performing the operation of switching between support and removal of support for the supported portions of these transported articles.

A transport device according to the present invention includes:

a pair of supporting portions that support a supported portion provided at an upper end of a transported article on both sides in a lateral width direction of the transported article;

a moving body that supports the pair of supporting portions; and a transporting drive portion that moves the moving body, wherein as the transported article, a small transported article and a large transported article having a greater volume than the small transported article can be used, the supported portion of the large transported article is formed to be wider than the supported portion of the small transported article in the lateral width direction, a pair of large-article supporting portions that support the supported portion of the large transported article and a pair of small-article supporting portions that support the supported portion of the small transported article are separately provided as the pair of supporting portions, the transport device includes: a large-article drive portion that moves each of the pair of large-article supporting portions between a large-article supporting position and a large-article retracted position, the large-article supporting position being a position at which an interval with the other large-article supporting portion in the lateral width direction is narrower than a lateral width of the supported portion of the large transported article, and the large-article retracted position being a position at which the interval with the other large-article supporting portion in the lateral width direction is wider than the lateral width of the supported portion of the large transported article; and a small-article drive portion that moves each of the pair of small-article supporting portions between a small-article supporting position and a small-article retracted position, the small-article supporting position being a position at which an interval with the other small-article supporting portion in the lateral width direction is narrower than a lateral width of the supported portion of the small transported article, and the small-article retracted position being a position at which the interval with the other small-article supporting portion in the lateral width direction is wider than the lateral width of the supported portion of the small transported article and is narrower than the lateral width of the supported portion of the large transported article, the small-article retracted position is set at a height at which the pair of small-article supporting portions are located above the supported portion of the large transported article supported by the pair of large-article supporting portions, and the pair of small-article supporting portions are provided between the pair of large-article supporting portions in the lateral width direction.

With this configuration, it is possible to support the supported portion of the large transported article by the pair of large-article supporting portions by moving the pair of large-article supporting portions from the large-article retracted position to the large-article supporting position. Then, it is possible to transport the large transported article by moving the moving body in a state in which the supported portion of the large transported article is supported by the pair of large-article supporting portions in this way.

It is also possible to support the supported portion of the small transported article by the pair of small-article supporting portions by moving the pair of small-article supporting portions from the small-article retracted position to the small-article supporting position. Then, the small transported article can be transported by moving the moving body in a state in which the supported portion of the small transported article is supported by the pair of small-article supporting portions in this way.

Also, the large-article retracted position is set to a position at which the interval between the pair of large-article supporting portions is wider than the lateral width of the supported portion of the large transported article, whereas the small-article retracted position is set to a position at which the interval between the pair of small-article supporting portions is wider than the lateral width of the supported portion of the small transported article and is narrower than the lateral width of the supported portion of the large transported article.

That is, the interval between the pair of small-article supporting portions located at the small-article retracted position is narrower in the lateral width direction than the interval between the pair of large-article supporting portions located at the large-article retracted position. Accordingly, at the time of moving the pair of small-article supporting portions between the small-article retracted position and the small-article supporting position, the movement distance can be made relatively short, thus achieving a reduction in the time required at the time of supporting the small transported article or removing the support therefor.

The small-article retracted position is set to a height at which the pair of small-article supporting portions are located above the supported portion supported by the pair of large-article supporting portions. Accordingly, even if the pair of small-article supporting portions are disposed between the pair of large-article supporting portions in order to reduce the size of the transport device, the supported portion of the large transported article supported by the pair of large-article supporting portions can be prevented from coming into contact with the pair of small-article supporting portions located at the small-article retracted position. Therefore, it is possible to transport the large transported article and the small transported article.

Thus, it has become possible to provide a transport device capable of transporting the large transported article and the small transported article, while promptly performing the operation of switching between support and removal of support for the supported portions of these transported articles.

Hereinafter, examples of preferred embodiments of the present invention will be described.

In an embodiment of the transport device according to the present invention, it is preferable that the pair of large-article supporting portions are supported by the moving body so as to be pivotable about a large-article pivot axis extending along a front-back direction that is orthogonal to the lateral width direction, and are configured to be movable between the large-article supporting position and the large-article retracted position by being pivoted about the large-article pivot axis, and the pair of small-article supporting portions are supported by the moving body so as to be pivotable about a small-article pivot axis extending along the front-back direction, and are configured to be movable between the small-article supporting position and the small-article retracted position by being pivoted about the small-article pivot axis.

With this configuration, the pair of large-article supporting portions can be moved in the lateral width direction and the up-down direction between the large-article retracted position and the large-article supporting position by pivoting the pair of large-article supporting portions about the large-article pivot axis. Also, the pair of small-article supporting portions can be moved in the lateral width direction and the up-down direction between the small-article retracted position and the small-article supporting position by pivoting the pair of small-article supporting portions about the small-article pivot axis.

Since the pair of large-article supporting portions and the pair of small-article supporting portions can be moved between the retracted position and the supporting position by simply pivoting them about the pivot axis in this way, it is possible to achieve a simplified configuration as compared with the configuration in which a mechanism for moving the supporting portions in the lateral width direction and a mechanism for moving the supporting portions in the up-down direction are separately provided.

In an embodiment of the transport device according to the present invention, it is preferable that in the pair of large-article supporting portions, the large-article supporting portion located on a first direction side that is one side in the lateral width direction is used as a first large-article supporting portion, and the large-article supporting portion located on a second direction side that is a side opposite to the first direction side in the lateral width direction is used as a second large-article supporting portion, in the pair of small-article supporting portions, the small-article supporting portion located on the first direction side is used as a first small-article supporting portion, and the small-article supporting portion located on the second direction side is used as a second small-article supporting portion, a first operation portion that moves the first large-article supporting portion and the first small-article supporting portion, and a second operation portion that moves the second large-article supporting portion and the second small-article supporting portion are provided, the first operation portion is provided such that, in a state in which the first operation portion moves from a first reference position toward the first direction side to press a large-article operated part of the first large-article supporting portion that is located above the large-article pivot axis toward the first direction side, thereby moving the first large-article supporting portion from the large-article retracted position to the large-article supporting position, and moves from the first reference position toward the second direction side to press a small-article operated part of the first small-article supporting portion that is located below the small-article pivot axis toward the second direction side, thereby moving the first small-article supporting portion from the small-article retracted position to the small-article supporting position, at least a part of the first operation portion is located between the first large-article supporting portion and the first small-article supporting portion in the lateral width direction, the second operation portion is provided such that, in a state in which the second operation portion moves from a second reference position toward the second direction side to press a large-article operated part of the second large-article supporting portion that is located above the large-article pivot axis toward the second direction side, thereby moving the second large-article supporting portion from the large-article retracted position to the large-article supporting position, and moves from the second reference position toward the first direction side to press a small-article operated part of the second small-article supporting portion that is located below the small-article pivot axis to the first direction side, thereby moving the second small-article supporting portion from the small-article retracted position to the small-article supporting position, at least a part of the second operation portion is located between the second large-article supporting portion and the second small-article supporting portion in the lateral width direction, a linking portion is provided that links the first operation portion and the second operation portion to each other so as to synchronically move the first operation portion and the second operation portion in directions opposite to each other in the lateral width direction, and a supporting drive portion that drives the linking portion is provided as the large-article drive portion and the small-article drive portion.

With this configuration, through operation of the linking portion, the first large-article supporting portions can be moved from the large-article retracted position to the large-article supporting position by moving the first operation portion toward the first direction side, and the second large-article supporting portion can be moved from the large-article retracted position to the large-article supporting position by moving the second operation portion toward the second direction side. Furthermore, through operation of the linking portion, the first small-article supporting portion can be moved from the small-article retracted position to the small-article supporting position by moving the first operation portion toward the second direction side, and the second small-article supporting portion can be moved from the small-article retracted position to the small-article supporting position by moving the second operation portion toward the first direction side.

Then, the movement of the first operation portion in the first direction and the movement of the second operation portion in the second direction can be synchronized, and the movement of the first operation portion in the second direction and the movement of the second operation portion in the first direction can also be synchronized. Accordingly, the transported article can be easily supported as appropriate on both sides in the lateral width direction by simultaneously moving the pair of supporting portions.

Furthermore, one supporting drive portion that drives the linking portion can be provided with the function of the large-article drive portion that moves the pair of large-article supporting portions between the large-article retracted position and the large-article supporting position, and the function of the small-article drive portion that moves the pair of small-article supporting portions between the small-article retracted position and the small-article supporting position. Accordingly, it is possible to reduce the number of drive portions.

In an embodiment of the transport device according to the present invention, the transport device preferably includes: a first large-article biasing member that biases the large-article operated part of the first large-article supporting portion toward the second direction side; a second large-article biasing member that biases the large-article operated part of the second large-article supporting portion toward the first direction side; a first small-article biasing member that biases the small-article operated part of the first small-article supporting portion toward the first direction side; and a second small-article biasing member that biases the small-article operated part of the second small-article supporting portion toward the second direction side.

With this configuration, in a state in which the first large-article supporting portion is moved to the first large-article supporting position, the operated part (large-article operated part) of the first large-article supporting portion is biased by the first large-article biasing member toward the second direction side where the first operation portion is present. Accordingly, the operated part of the first large-article supporting portion is pressed against the first operation portion, and the first large-article supporting portion can be held at the first large-article supporting position. Likewise, the second large-article supporting portion can be held at the second large-article supporting position, the first small-article supporting portion can be held at the first small-article supporting position, and the second small-article supporting portion can be held at the second small-article supporting position.

Since each of the pair of large-article supporting portions can be held at the large-article supporting position and each of the pair of small-article supporting portions can be held at the small-article supporting position in this way, it is possible to appropriately support and transport the large transported article and the small transported article.

DETAILED DESCRIPTION

Figure 1:
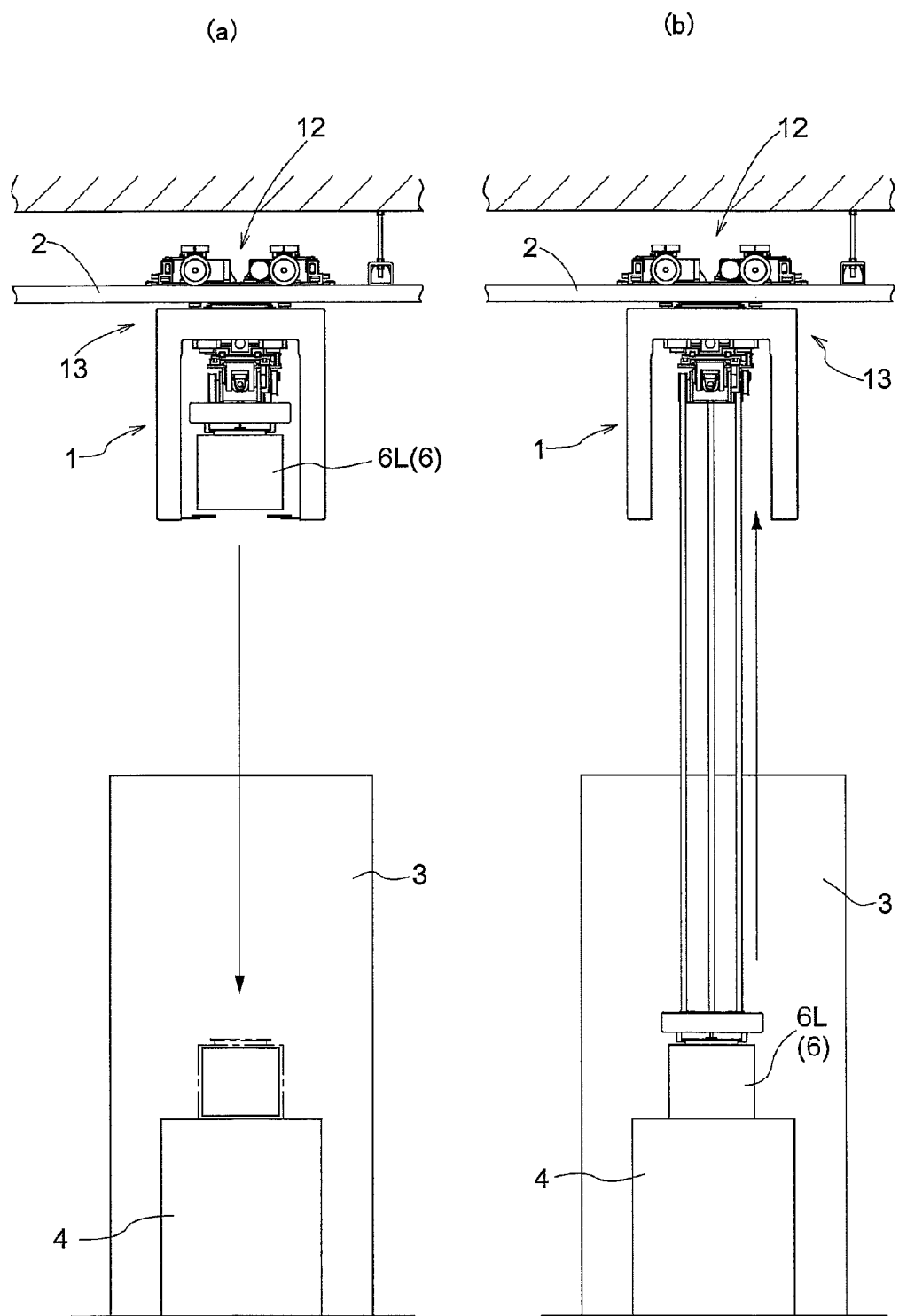
FIG. 1 are front views of an article transport facility.

Hereinafter, embodiments of an article transport facility including a transport device according to the present invention will be described with reference to the accompanying drawings.

As shown in FIGS. 1 to 4, the article transport facility is provided with an overhead guided vehicle 1 serving as a transport device, a processing device 3 that performs processing on a substrate, and an article supporting platform 4 provided on the floor side in a state in which it is adjacent to the processing device 3. The overhead guided vehicle 1 is guided and supported by a traveling rail 2 provided on the ceiling side along a traveling path, and travels along the traveling path. A transported article 6 is a container that accommodates the contents for transport, and specifically is a FOUP that accommodates semiconductor wafers.

Figure 2:
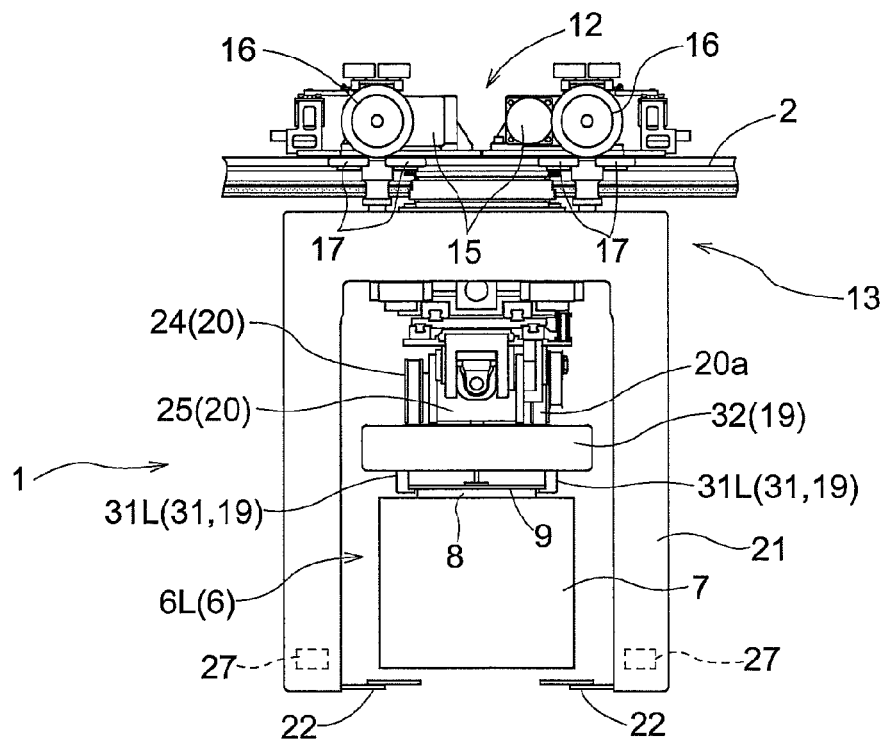
FIG. 2 is a front view of a transport device supporting a large transported article.
Figure 3:
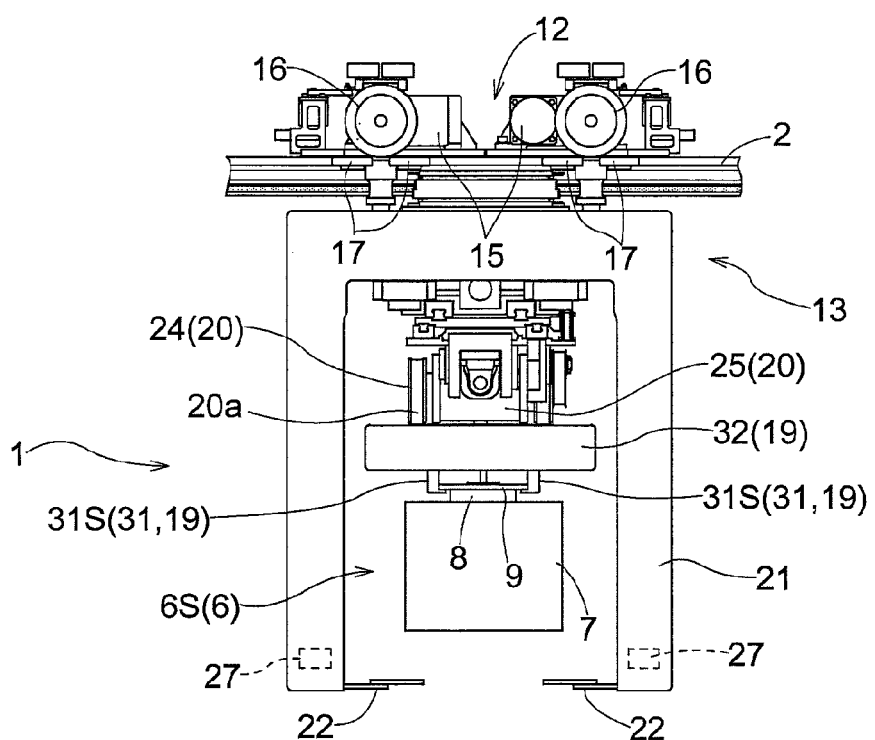
FIG. 3 is a front view of the transport device supporting a small transported article.

As shown in FIGS. 2 and 3, the transported article 6 includes a body portion 7 that accommodates a plurality of substrates, a supported portion 9 that is located above the body portion 7 and is provided at an upper end of the transported article 6, and a connecting portion 8 that connects the body portion 7 and the supported portion 9. The supported portion 9 is formed in a shape protruding from the connecting portion 8 in the container front-rear direction and the container left-right direction, and a gap into which a supporting portion 31, which will be described below, is inserted in the lateral width direction (the container lateral width direction) is formed between the body portion 7 and the supported portion 9. The container front-rear direction and the container right-left direction are orthogonal to each other, and each of the container front-rear direction and the container right-left direction is orthogonal to the up-down direction (the container up-down direction). Also, a recessed portion 10 (see FIGS. 6 and 7) with which a projection portion 34 included in the overhead guided vehicle 1 is engaged from above is provided on the top surface of the supported portion 9. Although not shown, an opening for placing and taking substrates in and out of the accommodation space of the body portion 7 is formed in the front surface of the body portion 7.

As shown in FIGS. 2 and 3, as the transported article 6, a small transported article 6S (e.g., a FOUP accommodating 300 mm sized semiconductor wafers) and a large transported article 6L (e.g., a FOUP accommodating 450 mm sized semiconductor wafers) having a larger volume than that of the small transported article 6S can be used. The body portion 7 of the large transported article 6L is formed to be larger than the body portion 7 of the small transported article 6S in the up-down direction, the container right-left direction, and the container front-rear direction, and can accommodate larger substrates than the body portion 7 of the small transported article 6S.

FIG. 1 are diagrams showing a state in which the overhead guided vehicle 1 transports the transported article 6 to and from the article supporting platform 4 of the processing device 3 in the case of the large transported article 6L. FIG. 2 is a diagram showing the overhead guided vehicle 1 transporting a large transported article 6L. FIG. 3 is a diagram showing the overhead guided vehicle 1 transporting a small transported article 6S.

Figure 6:
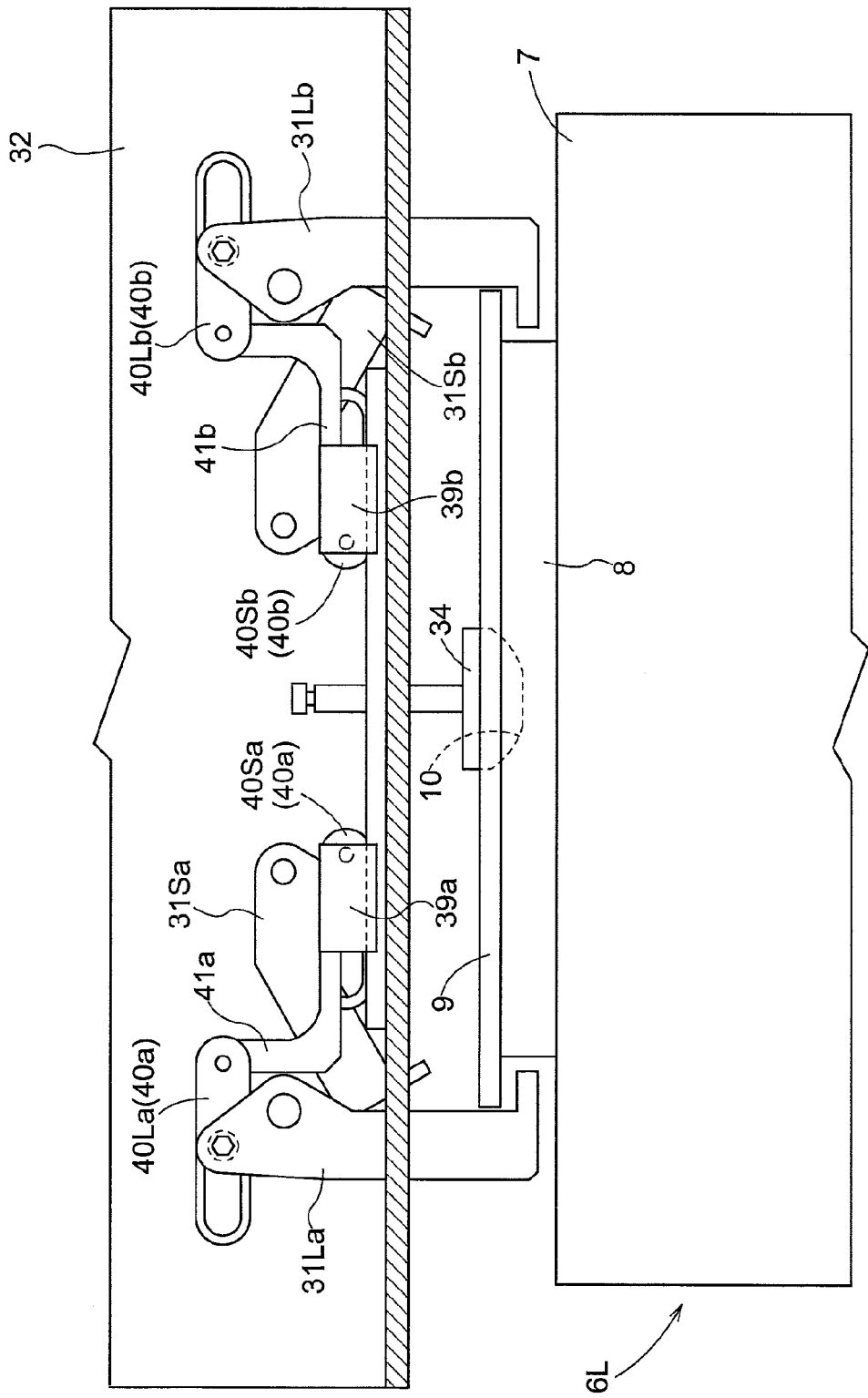
FIG. 6 is a vertically sectioned front view of the moving body in which a pair of large-article supporting portions are moved to a supporting position.
Figure 7:
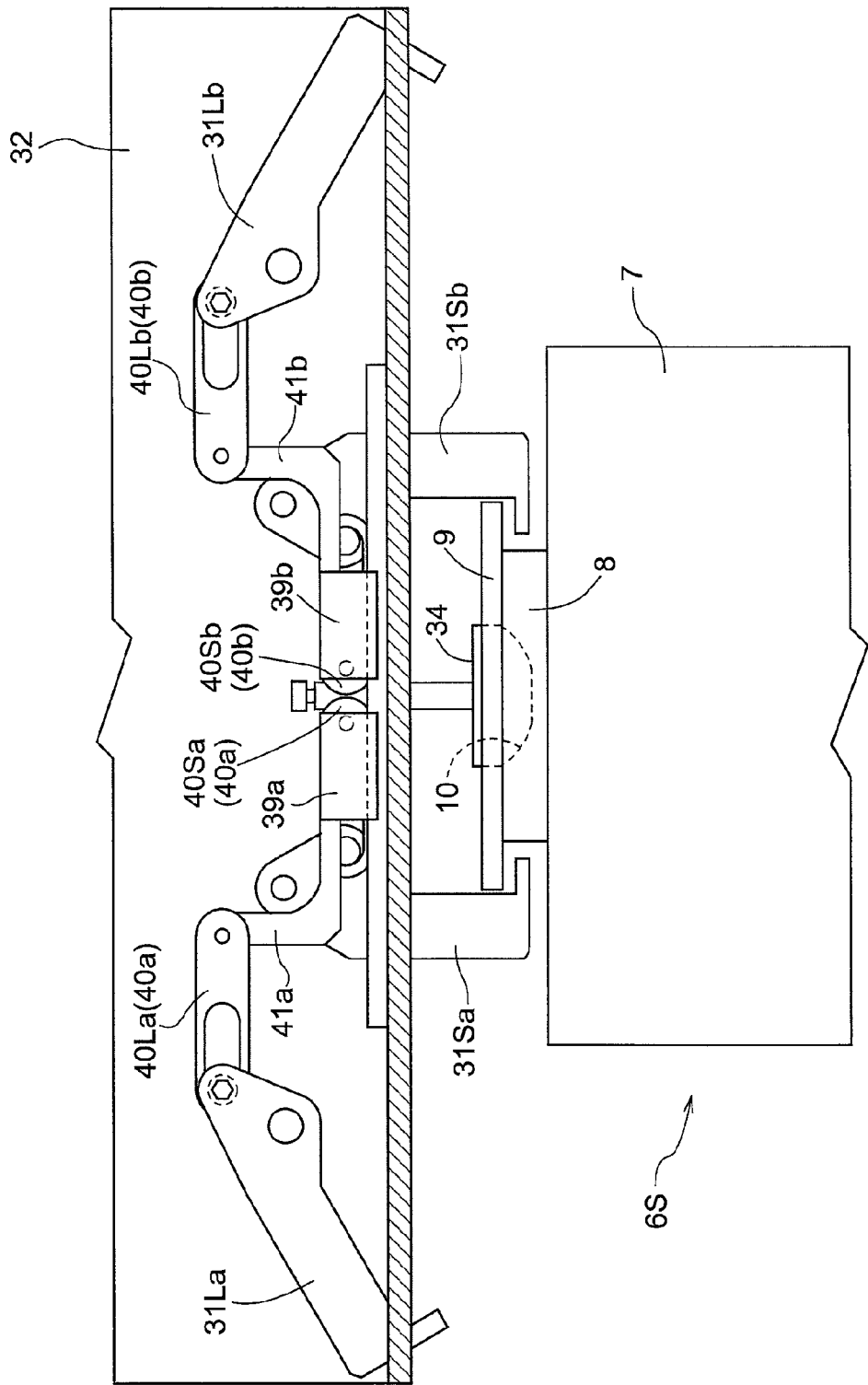
FIG. 7 is a vertically sectioned front view of the moving body in which a pair of small-article supporting portions are moved to a supporting position.

As shown in FIGS. 6 and 7, the connecting portion 8 of the large transported article 6L is formed to be longer in the up-down direction as compared with the connecting portion 8 of the small transported article 6S. Therefore, the gap formed in the up-down direction between the body portion 7 and the supported portion 9 of the large transported article 6L is wider than the gap formed in the up-down direction between the body portion 7 and the supported portion 9 of the small transported article 6S.

Additionally, the supported portion 9 of the large transported article 6L is formed to be wider in the container front-rear direction and the container right-left direction than the supported portion 9 of the small transported article 6S. The recessed portion 10 of the large transported article 6L and the recessed portion 10 of the small transported article 6S are formed in the same size and shape.

Overhead Guided Vehicle

As shown in FIGS. 2 and 3, the overhead guided vehicle 1 includes a traveling/moving portion 12 that travels on the traveling rail 2 along the traveling path, and an elevation supporting portion 13 that is suspended from and supported by the traveling/moving portion 12 so as to be located below the traveling rail 2. The elevation supporting portion 13 supports a supporting mechanism 19, which supports the transported article 6, such that the supporting mechanism 19 can be moved up and down.

Here, the direction extending along the traveling direction of the overhead guided vehicle 1 is referred to as a lateral width direction, and the direction that intersects (here, the direction orthogonal to) the lateral width direction and that is orthogonal to the up-down direction is referred to as a front-back direction. The transported article 6 is supported by the elevation supporting portion 13 in a state in which the container right-left direction thereof is along the lateral width direction of the overhead guided vehicle 1. Accordingly, in the following description, the container right-left direction of the transported article 6 is referred to as the lateral width direction. Additionally, one side (the left side in FIG. 4) in the lateral width direction is referred to as a first direction side, and the side opposite to the first direction side (the right side in FIG. 4) in the lateral width direction is referred to as a second direction side.

The traveling/moving portion 12 is provided with drive wheels 16 that are rotationally driven by traveling motors 15 so as to roll on the top surface of the traveling rail 2, and rotatable guide wheels 17 that come into contact with side surfaces of the traveling rail 2. Also, the traveling/moving portion 12 is configured to be guided by the traveling rail 2 and to travel along the traveling path by the drive wheels 16 being rotationally driven by the traveling motors 15 and the guide wheels 17 coming into contact with and guided by the traveling rail 2.

The elevation supporting portion 13 includes a supporting mechanism 19 that supports the transported article 6, an elevation operation mechanism 20 that moves the supporting mechanism 19 up and down, a cover portion 21 that covers the upper side of the transported article 6 located at a transporting position and the opposite sides of the transported article 6 in the traveling path longitudinal direction, and fall preventing bodies 22 for preventing the transported article 6 supported at the transporting position by the supporting mechanism 19 from falling.

The elevation operation mechanism 20 is provided with winding bodies 24 that wind take-up belts 20a whose ends are connected to the supporting mechanism 19 to support it, and an elevating motor 25 that rotationally drives the winding body 24. Then, the take-up belts 20a are taken up and let out by the winding bodies 24 being rotationally driving by the elevating motor 25 in the forward and backward directions, and thereby, the supporting mechanism 19 is moved up and down. As shown in FIGS. 2 and 3, in a state in which the take-up belts 20a have been taken up, the transported article 6 (the large transported article 6L and the small transported article 6S) supported by the supporting mechanism 19 is located at the transporting position within the cover portion 21.

A pair of fall preventing bodies 22 are provided in a state in which they are arranged side by side in the lateral width direction, and are configured such that the interval between the pair of fall preventing bodies 22 can be freely changed between a receiving interval (see FIGS. 1 (*a*), 2 and 3) that is narrower than the width of the small transported article 6S in the lateral width direction, and a retracting interval (see FIG. 1 (b)) that is wider than the width of the large transported article 6L in the lateral width direction.

Also, by changing the interval between the pair of fall preventing bodies 22 to the receiving interval by the driving of fall preventing motors 27, it is possible to prevent the falling of the transported article 6 by receiving the transported article 6 by the fall preventing bodies 22 even if the support by the supporting mechanism 19 is removed during traveling of the overhead guided vehicle 1. Furthermore, by changing the interval between the pair of fall preventing bodies 22 to the retracting interval by the driving of the fall preventing motors 27, it is possible to transfer the transported article 6 to the article supporting platform 4 and receive the transported article 6 from the article supporting platform 4 by moving the supporting mechanism 19 up and down as shown in FIG. 1.

Supporting Mechanism

Next, the supporting mechanism 19 of the overhead guided vehicle 1 will be described.

Figure 4:
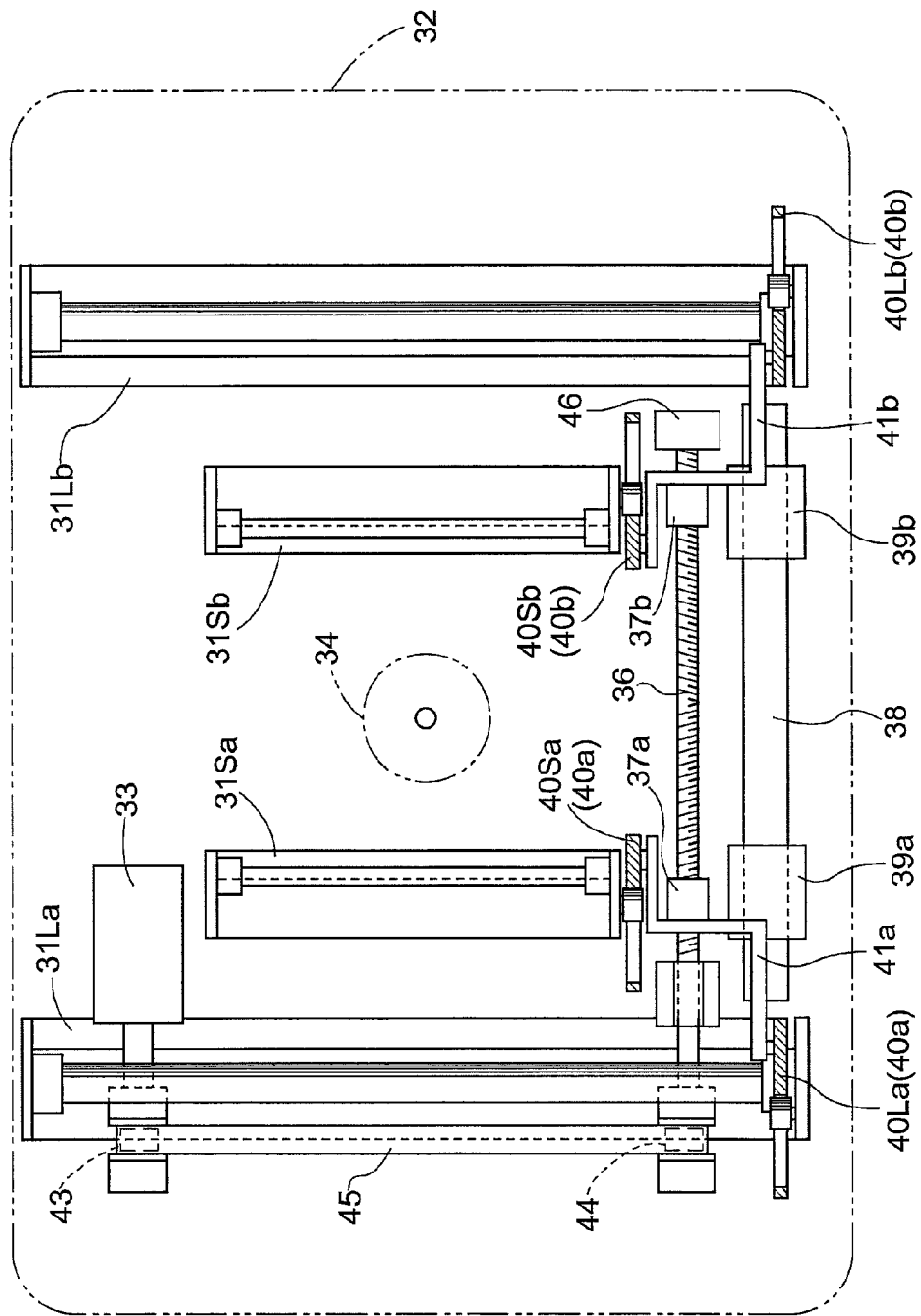
FIG. 4 is a plan view showing an internal structure of a moving body.
Figure 5:
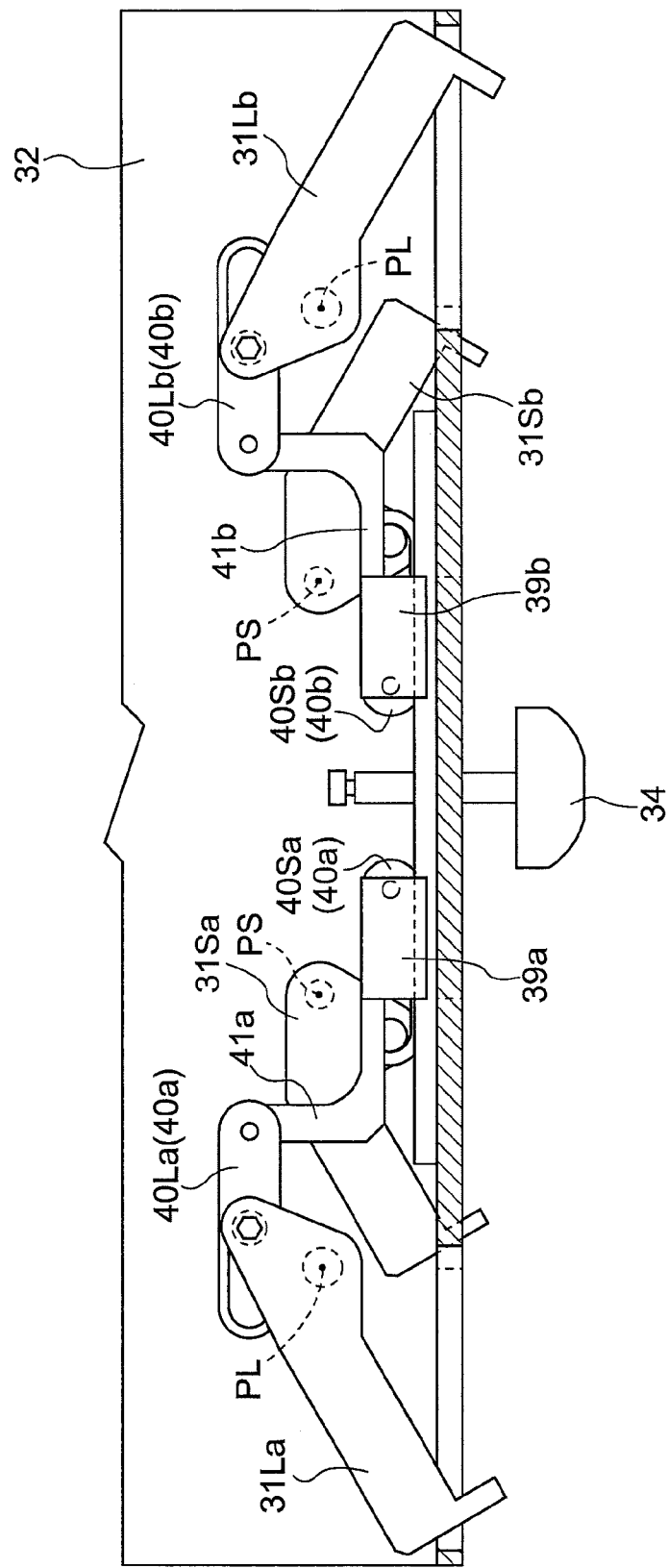
FIG. 5 is a vertically sectioned front view of the moving body.

As shown in FIGS. 4 and 5, the supporting mechanism 19 of the overhead guided vehicle 1 is provided with a pair of supporting portions 31 on which the supported portion 9 of the transported article 6 is placed and supported, a moving body 32 that supports the pair of supporting portions 31 so as to be pivotable about an axis extending along the front-back direction, a supporting motor 33 serving as a supporting drive portion that moves the position of the pair of supporting portions 31 relative to the moving body 32 between the supporting position and the retracted position, and a projection portion 34 for being engaged with the recessed portion 10 of the transported article 6 so as to center the transported article 6 relative to the moving body 32 in the horizontal direction. The pair of supporting portions 31 support the supported portion 9 of the transported article 6 on both sides in the lateral width direction.

The moving body 32 is moved along the horizontal direction by the overhead guided vehicle 1 being caused to travel/move by the driving of the traveling motors 15, and is moved up and down by the supporting mechanism 19 being moved up and down by the driving of the elevating motor 25. Accordingly, the traveling motors 15 and the elevating motor 25 correspond to the transporting drive portion that moves the moving body 32.

As the pair of supporting portions 31, a pair of large-article supporting portions 31L on which the supported portion 9 of the large transported article 6L is placed and supported, and a pair of small-article supporting portions 31S on which the supported portion 9 of the small transported article 6S is placed and supported are separately provided. That is, the supporting mechanism 19 is provided with two pairs of supporting portions 31, or in other words, a total of four supporting portions 31. Also, the pair of small-article supporting portions 31S are provided between the pair of large-article supporting portions 31L in the lateral width direction. Additionally, the pair of small-article supporting portions 31S are provided at the same height as the pair of large-article supporting portions 31L in the up-down direction. That is, the placement region of the pair of small-article supporting portions 31S in the up-down direction has a portion overlapping the placement region of the pair of large-article supporting portions 31L in the up-down direction.

As shown in FIGS. 5 and 6, each of the pair of large-article supporting portions 31L is supported by the moving body 32 so as to be pivotable about a large-article pivot axis PL extending along the front-back direction. Each of the pair of large-article supporting portions 31L is configured to move to a large-article supporting position (see FIG. 6) and a large-article retracted position (see FIG. 5) relative to the moving body 32 by being pivoted about the large-article pivot axis PL.

Further, as shown in FIGS. 5 and 7, each of the pair of small-article supporting portions 31S is supported by the moving body 32 so as to be pivotable about a small-article pivot axis PS extending along the front-back direction. Each of the pair of small-article supporting portions 31S is configured to move to a small-article supporting position (see FIG. 7) and a small-article retracted position (see FIG. 5) relative to the moving body 32 by being pivoted about the small-article pivot axis PS.

Thus, the moving body 32 supports each of the pair of large-article supporting portions 31L and each of the pair of small-article supporting portions 31S so as to be pivotable about the pivot axis extending along the front-back direction.

As shown in FIGS. 5 to 7, the large-article supporting position is set to a position at which the interval with the other large-article supporting portion 31L in the lateral width direction (the interval between the pair of large-article supporting portions 31L in the lateral width direction) is narrower than the lateral width of the supported portion 9 of the large transported article 6L and is wider than the lateral width of the supported portion 9 of the small transported article 6S. The large-article retracted position is set to a position at which the interval with the other large-article supporting portion 31L in the lateral width direction is wider than the lateral width of the supported portion 9 of the large transported article 6L. The interval between the pair of large-article supporting portions 31L in the lateral width direction is the interval between supporting parts, which will be described below, of the large-article supporting portions 31L in the lateral width direction. Further, the large-article retracted position is set at a position that is higher than the large-article supporting position by a predetermined height (the position at which the supporting part is higher by the predetermined height), and is set at a height at which the pair of large-article supporting portions 31L are located above the supported portion 9 of the small transported article 6S placed and supported on the pair of small-article supporting portions 31S.

The small-article supporting position is set to a position at which the interval with the other small-article supporting portion 31S in the lateral width direction (the interval between the pair of small-article supporting portions 31S in the lateral width direction) is narrower than the lateral width of the supported portion 9 of the small transported article 6S. The small-article retracted position is set to a position at which the interval with the other small-article supporting portion 31S in the lateral width direction is wider than the lateral width of the supported portion 9 of the small transported article 6S and is narrower than the lateral width of the supported portion 9 of the large transported article 6L. The interval between the pair of small-article supporting portions 31S in the lateral width direction is the interval between supporting parts, which will be described below, of the small-article supporting portions 31S in the lateral width direction. The small-article retracted position is set at a position that is higher than the small-article supporting position by a predetermined height (the position at which the supporting part is higher than the predetermined height), and is set at a height at which the pair of small-article supporting portions 31S are located above the supported portion 9 of the large transported article 6L placed and supported on the pair of large-article supporting portions 31L.

Figure 8:
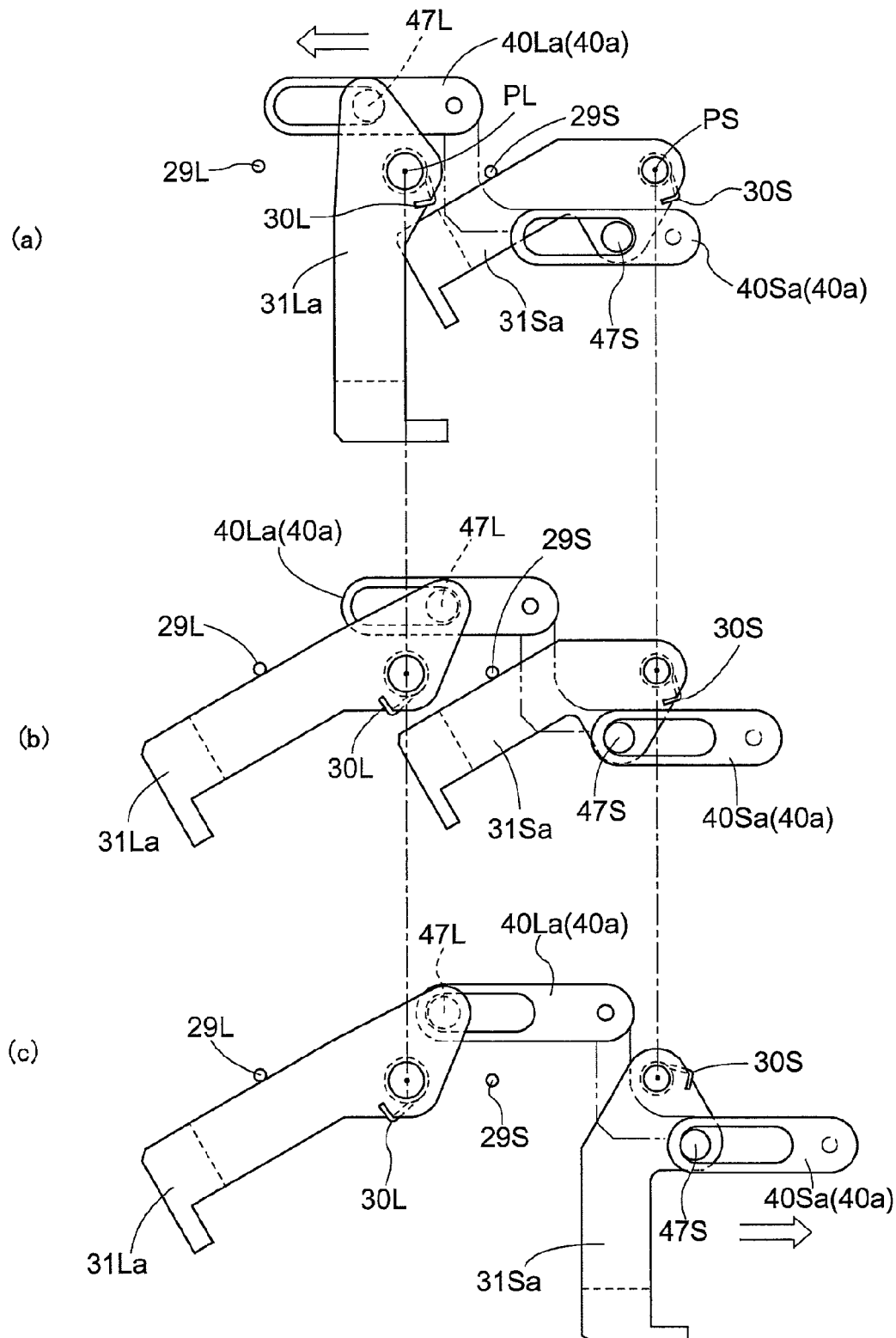
FIG. 8 are diagrams showing action of movement of a first operation portion.

The pair of large-article supporting portions 31L and the pair of small-article supporting portions 31S are supported by the moving body 32 such that the large-article pivot axis PL and the small-article pivot axis PS are located at the same height (see FIG. 8). Also, the interval in the up-down direction from the large-article pivot axis PL to the placement surface of the large-article supporting portion 31L in a state in which the large-article supporting portions 31L are positioned at the large-article supporting positions is the same as the interval in the up-down direction from the small-article pivot axis PS to the placement surface of the small-article supporting portions 31S in a state in which the small-article supporting portions 31S are positioned at the small-article supporting positions.

As shown in FIGS. 5 and 6, in the pair of large-article supporting portions 31L, the large-article supporting portion 31L located on the first direction side in the lateral width direction is denoted by a first large-article supporting portion 31La, and the large-article supporting portion 31L located on the second direction side in the lateral width direction is denoted by a second large-article supporting portion 31Lb. Also, as shown in FIG. 6, the supporting mechanism 19 is configured to support the large transported article 6L in a suspended manner by the first direction-side end of the supported portion 9 of the large transported article 6L being placed and supported on the first large-article supporting portion 31La, and the second direction-side end of the supported portion 9 of the large transported article 6L is being placed and supported on the second large-article supporting portion 31Lb.

As shown in FIGS. 5 and 7, in the pair of small-article supporting portions 31S, the small-article supporting portion 31S located on the first direction side in the lateral width direction is denoted by a first small-article supporting portion 31Sa, and the small-article supporting portion 31S located on the second direction side in the lateral width direction is denoted by a second small-article supporting portion 31Sb. Also, as shown in FIG. 7, the supporting mechanism 19 is configured to support the small transported article 6S in a suspended manner by the first direction-side end of the supported portion 9 of the small transported article 6S being placed and supported on the first small-article supporting portion 31Sa, and the second direction-side end of the supported portion 9 of the small transported article 6S being placed and supported on the second small-article supporting portion 31Sb.

As shown in FIG. 8, each of the pair of large-article supporting portions 31L is biased by a large-article biasing member 30L from the supporting position toward the retracted position, and is restricted from pivoting from the retracted position toward the direction opposite to the supporting position by being in contact with a large-article restricting member 29L. Accordingly, as shown in FIGS. 8 (b) and (c), each of the pair of large-article supporting portions 31L is held at the retracted position by being pressed against the large-article restricting member 29L by the biasing force of the large-article biasing member 30L.

Each of the pair of small-article supporting portions 31S is biased by a small-article biasing member 30S from the supporting position toward the retracted position, and is restricted from pivoting from the retracted position toward the direction opposite to the supporting position by being in contact with a small-article restricting member 29S. Accordingly, as shown in FIGS. 8 (a) and (b), each of the pair of small-article supporting portions 31S is held at the retracted position by being pressed against the small-article restricting member 29S by the biasing force of the small-article restricting member 29S.

FIG. 8 depict only the first large-article supporting portion 31La of the pair of large-article supporting portions 31L, and the first small-article supporting portion 31Sa of the pair of small-article supporting portions 31S. The large-article biasing member 30L and the small-article biasing member 30S are composed of a coil spring.

As shown in FIG. 4, the supporting mechanism 19 is provided with a first moving block 37a and a second moving block 37b that are threadably engaged with a rotational shaft 36 and that move in the lateral width direction with rotation of the rotational shaft 36, a first guide block 39a and a second guide block 39b that are movable in the lateral width direction while being guided by the guide rail 38, a first large-article operation portion 40La that moves the first large-article supporting portion 31La, a second large-article operation portion 40Lb that moves the second large-article supporting portion 31Lb, a first small-article operation portion 40Sa that moves the first small-article supporting portion 31Sa, and a second small-article operation portion 40Sb that moves the second small-article supporting portion 31Sb.

Also, the first moving block 37a, the first guide block 39a, the first large-article operation portion 40La, and the first small-article operation portion 40Sa that are located on the same first direction side in the lateral width direction are connected to one another by a first connecting member 41a such that they can move together in the lateral width direction.

The second moving block 37b, the second guide block 39b, the second large-article operation portion 40Lb, and the second small-article operation portion 40Sb that are located on the same second direction side in the lateral width direction are connected to one another by a second connecting member 41b such that they can move together in the lateral width direction.

The first large-article operation portion 40La that moves the first large-article supporting portion 31La and the first small-article operation portion 40Sa that moves the first small-article supporting portion 31Sa constitute a first operation portion 40a. The second large-article operation portion 40Lb that moves the second large-article supporting portion 31Lb and the second small-article operation portion 40Sb that moves the second small-article supporting portion 31Sb constitute a second operation portion 40b.

Also, the rotational shaft 36, the first moving block 37a, the second moving block 37b, the first connecting member 41a, and the second connecting member 41b constitute a linking portion that links the first operation portion 40a and the second operation portion 40b to each other so as to move the first operation portion 40a and the second operation portion 40b in the lateral width direction. The linking portion links the first operation portion 40a to the second operation portion 40b so as to synchronically move the first operation portion 40a and the second operation portion 40b in directions opposite to each other in the lateral width direction.

Furthermore, the supporting motor 33 corresponds to the supporting drive portion that drives the linking portion, and is provided as the large-article drive portion that moves each of the pair of large-article supporting portions 31L to the large-article supporting position and the large-article retracted position, and the small-article drive portion that moves each of the pair of small-article supporting portions 31S to the small-article supporting position and the small-article retracted position. That is, the supporting motor 33 has the function of the large-article drive portion and the function of the small-article drive portion.

As shown in FIGS. 5 to 8, the first operation portion 40a moves from a first reference position (see FIG. 5) toward the first direction side to press a large-article operated part 47L of the first large-article supporting portion 31La that is located above the large-article pivot axis PL toward the first direction side, thereby moving the first large-article supporting portion 31La from the large-article retracted position to the large-article supporting position. The first operation portion 40a moves from the first reference position toward the second direction side to press a small-article operated part 47S of the first small-article supporting portion 31Sa that is located below the small-article pivot axis PS toward the second direction side, thereby moving the first small-article supporting portion 31Sa from the small-article retracted position to the small-article supporting position.

In this way, the first operation portion 40a is provided so as to move the first large-article supporting portion 31La by moving from the first reference position toward the first direction side, and to move the first small-article supporting portion 31Sa by moving from the first reference position toward the second direction side. Also, the first operation portion 40a is provided such that at least a part of the first operation portion 40a is located between the first large-article supporting portion 31La and the first small-article supporting portion 31Sa in the lateral width direction. Specifically, a pressing part of the first operation portion 40a that presses the large-article operated part 47L toward the first direction side and a pressing part of the first operation portion 40a that presses the small-article operated part 47S toward the second direction side are disposed between the large-article operated part 47L of the first large-article supporting portion 31La and the small-article operated part 47S of the first small-article supporting portion 31Sa in the lateral width direction.

The second operation portion 40b presses the large-article operated part 47L of the second large-article supporting portion 31Lb that is located above the large-article pivot axis PL toward the second direction side by moving from a second reference position (see FIG. 5) toward the second direction side, thereby moving the second large-article supporting portion 31Lb from the large-article retracted position to the large-article supporting position. Also, the second operation portion 40b presses the small-article operated part 47S of the second small-article supporting portion 31Sb that is located below the small-article pivot axis PS toward the first direction side by moving from the second reference position toward the first direction side, thereby moving the second small-article supporting portion 31Sb from the small-article retracted position to the small-article supporting position.

Thus, the second operation portion 40b is provided to move the second large-article supporting portion 31Lb by moving from the second reference position toward the second direction side, and to move the second small-article supporting portion 31Sb by moving from the second reference position toward the first direction side. Also, the second operation portion 40b is provided such that at least a part of the second operation portion 40b is located between the second large-article supporting portion 31Lb and the second small-article supporting portion 31Sb in the lateral width direction. Specifically, a pressing part of the second operation portion 40b that presses the large-article operated part 47L toward the second direction side and a pressing part of the second operation portion 40b that presses the small-article operated part 47S toward the first direction side are disposed between the large-article operated part 47L of the second large-article supporting portion 31Lb and the small-article operated part 47S of the second small-article supporting portion 31Sb in the lateral width direction.

As shown in FIG. 4, a drive-side pulley 43 is provided on the output shaft of the supporting motor 33, and a driven-side pulley 44 is provided on the first direction-side end of the rotational shaft 36. A drive belt 45 is wound across the drive-side pulley 43 and the driven-side pulley 44. The rotational shaft 36 is rotated in the forward or backward direction by rotating the supporting motor 33 in the forward or backward direction. Note that the moving body 32 is provided with a brake 46 that brakes the rotation of the rotational shaft 36.

The rotational shaft 36 is threaded to form threads thereon for threadably engaging the first moving block 37a and the second moving block 37b. The portion of the rotational shaft 36 that is located on the first direction side and with which the first moving block 37a is threadably engaged, and the portion thereof that is located on the second direction side and with which the second moving block 37b is threadably engaged have opposite direction threads. Accordingly, the movement direction of the first moving block 37a and the movement direction of the second moving block 37b when the rotational shaft 36 is rotated are opposite to each other.

Each of the four supporting portions 31 includes a supporting part formed in a plate shape extending along the front-back direction and a pair of connecting parts that are raised upward from both ends of the aforementioned supporting part in the front-back direction (formed so as to extend upward), and is formed in a U-shape when viewed in the lateral width direction. The top surfaces of the supporting parts form the placement surface on which the supported portion 9 is placed and supported. Also, the space surrounded by the supporting part (plate-shaped part) and the connecting parts of the first large-article supporting portion 31La is utilized to arrange therein the drive-side pulley 43, the driven-side pulley 44, the drive belt 45 and so forth.

Next, the operation structures of the pair of large-article supporting portions 31L and the pair of small-article supporting portions 31S will be described with reference to FIG. 8.

The operation structures of the first large-article supporting portion 31La and the first small-article supporting portion 31Sa and the operation structures of the second large-article supporting portion 31Lb and the second small-article supporting portion 31Sb are configured in the same manner except that they are reversed in the lateral width direction. Therefore, the operation structures of the first large-article supporting portion 31La and the first small-article supporting portion 31Sa will be described here, and the description of the operation structures of the second large-article supporting portion 31Lb and the second small-article supporting portion 31Sb will be omitted.

The first large-article supporting portion 31La is connected to the moving body 32 so as to pivot about the large-article pivot axis PL, and is provided with the large-article operated part 47L at a location above the large-article pivot axis PL of the first large-article supporting portion 31La. Accordingly, the first large-article supporting portion 31La is pivoted counterclockwise as a result of the large-article operated part 47L being pressed toward the first direction side, thereby being moved from the large-article retracted position to the large-article supporting position.

As the pressing is released, the first large-article supporting portion 31La is pivoted clockwise by the biasing force of the large-article biasing member 30L, thereby being moved from the large-article supporting position to the large-article retracted position.

Note that the large-article biasing member 30L shown in FIG. 8 corresponds to the first large-article biasing member that biases the large-article operated part 47L of the first large-article supporting portion 31La toward the second direction side. The illustration of the second large-article biasing member that biases the large-article operated part 47L of the second large-article supporting portion 31Lb toward the first direction side is omitted.

The first small-article supporting portion 31Sa is connected to the moving body 32 so as to pivot about the small-article pivot axis PS, and is provided with a small-article operated part 47S at a location below the small-article pivot axis PS of the first small-article supporting portion 31Sa. Accordingly, the first small-article supporting portion 31Sa is pivoted counterclockwise as a result of the small-article operated part 47S being pressed toward the second direction side, thereby being moved from the small-article retracted position to the small-article supporting position.

As the pressing is released, the first small-article supporting portion 31Sa is pivoted clockwise by the biasing force of the small-article biasing member 30S, thereby being moved from the small-article supporting position to the small-article retracted position.

Note that the small-article biasing member 30S shown in FIG. 8 corresponds to the first small-article biasing member that biases the small-article operated part 47S of the first small-article supporting portion 31Sa toward the first direction side. The illustration of the second small-article biasing member that biases the small-article operated part 47S of the second small-article supporting portion 31Sb toward the second direction side is omitted.

Also, as shown in FIGS. 8 (a) and (b), by moving the first operation portion 40a from the first reference position (see FIG. 8 (b)) toward the first direction side, the first large-article supporting portion 31La can be moved from the large-article retracted position to the large-article supporting position while the first small-article supporting portion 31Sa is maintained at the small-article retracted position.

Further, as shown in FIGS. 8 (b) and (c), by moving the first operation portion 40a from the first reference position toward the second direction side, the first small-article supporting portion 31Sa can be moved from the small-article retracted position to the small-article supporting position while the first large-article supporting portion 31La is maintained at the large-article retracted position.

The article transport facility is provided with a controller (not shown) that controls the operation of the overhead guided vehicle 1. The controller is configured to perform a transfer process for transferring the transported article 6 to the article supporting platform 4, and a receiving process for receiving the transported article 6 from the article supporting platform 4.

In the transfer process, first, in a state in which the overhead guided vehicle 1 supporting the transported article 6 is stopped at a stop position corresponding to the article supporting platform 4, the interval between the fall preventing bodies 22 is changed to the retracting interval, and thereafter, the take-up belts 20a are let out by a length corresponding to the difference in height between the undersurface of the transported article 6 at the transporting position and the placement surface of the article supporting platform 4. Then, when the transported article 6 is a large transported article 6L, the large transported article 6L is transferred to the article supporting platform 4 by moving the pair of large-article supporting portions 31L from the large-article supporting position to the large-article retracted position. When the transported article 6 is a small transported article 6S, the small transported article 6S is transferred to the article supporting platform 4 by moving the pair of small-article supporting portions 31S from the small-article supporting position to the small-article retracted position. Thereafter, the take-up belts 20a are taken up by a length corresponding to the difference between the height of the overhead guided vehicle 1 and the height of the supported portion 9 of the transported article 6 situated on at the article supporting platform 4. The operations of the traveling motors 15, the elevating motor 25, the fall preventing motors 27, and the supporting motor 33 are controlled so as to operate the various mechanisms in this manner, thereby performing the transfer process.

In the receiving process, first, in a state in which the overhead guided vehicle 1 without the transported article 6 is stopped at a stop position corresponding to the article supporting platform 4, the take-up belts 20a are let out by a length corresponding to the difference between the height of the overhead guided vehicle 1 and the height of the supported portion 9 of the transported article 6 situated on the article supporting platform 4. Then, when the transported article 6 is a large transported article 6L, the large transported article 6L is received from the article supporting platform 4 by moving the pair of large-article supporting portions 31L from the large-article retracted position to the large-article supporting position. When the transported article 6 is a small transported article 6S, the small transported article 6S is received from the article supporting platform 4 by moving the pair of small-article supporting portions 31S from the small-article retracted position to the small-article supporting position. Thereafter, the take-up belts 20a are taken up by a length corresponding to the difference in height between the undersurface of the transported article 6 at the transporting position and the placement surface of the article supporting platform 4. The operations of the traveling motors 15, the elevating motor 25, the fall preventing motors 27, and the supporting motor 33 are controlled so as to operate the various mechanisms, thereby performing the receiving process.

With the overhead guided vehicle 1 configured in this manner, the interval between the pair of small-article supporting portions 31S located at the small-article retracted position is narrower than the interval between the pair of large-article supporting portions 31L located at the large-article retracted position, and therefore, the movement distance of the pair of small-article supporting portions 31S can be made relatively short when they are moved between the small-article retracted position and the small-article supporting position. Accordingly, it is possible to shorten the time required at the time of supporting the small transported article 6S or removing the support.

Other Embodiments (1) Although the large-article pivot axis PL and the small-article pivot axis PS are provided at the same height in the above-described embodiment, the large-article pivot axis PL and the small-article pivot axis PS may be provided at different heights. Specifically, for example, the large-article pivot axis PL may be provided at a height higher than the height of the small-article pivot axis PS. In this case, the large-article operation portion and the small-article operation portion may be provided at a height that is lower than the large-article pivot axis PL and is higher than the small-article pivot axis PS.

(2) Although each of the pair of large-article supporting portions 31L is configured to be moved between the large-article supporting position and the large-article retracted position by being pivoted about the large-article pivot axis PL in the above-described embodiment, each of the pair of large-article supporting portions 31L may be configured to be moved between the large-article supporting position and the large-article retracted position by being separately moved in the left-right direction and the up-down direction. Although each of the pair of small-article supporting portions 31S is configured to be moved between the small-article supporting position and the small-article retracted position by being pivoted about the small-article pivot axis PS, each of the pair of small-article supporting portions 31S may be configured to be moved between the small-article supporting position and the small retracted position by being separately moved in the left-right direction and the up-down direction.

(3) The above-described embodiment is configured such that as supporting drive portion, one drive portion serving as the large-article drive portion and the small-article drive portion is provided to move four supporting portions 31. However, two drive portions respectively serving as the large-article drive portion and the small-article drive portion may be separately provided to move four supporting portions 31. Alternatively, a first large-article drive portion that moves the first large-article supporting portion 31La and a second large-article drive portion that moves the second large-article supporting portion 31Lb may be provided as the large-article drive portions, and a first small-article drive portion that moves the first small-article supporting portion 31Sa and a second small-article drive portion that moves the second small-article supporting portion 31Sb may be provided as the small-article drive portions. Then, four supporting portions 31 may be moved by the four drive portions.

(4) Although two types of transported articles 6, namely, the large transported article 6L and the small transported article 6S are transported as the transported article 6 in the above-described embodiment, three or more types of transported articles 6 may be transported as the transported article 6. Although two pairs of supporting portions 31, namely, the pair of large-article supporting portions 31L and the pair of small-article supporting portions 31S are provided as the pair of supporting portions 31, three or more pairs of supporting portions 31 may be provided.

(5) The first large-article biasing member, the second large-article biasing member, the first small-article biasing member, and the second small-article biasing member are provided to hold the supporting portion 31 at the supporting position by the biasing force of the biasing member in the above-described embodiment. However, the supporting portion 31 may be held at the supporting position without providing such a biasing member.

Specifically, for example, in the case of the first large-article supporting portion 31La, a pinion that rotates together with the first large-article supporting portion 31La about the large-article pivot axis PL may be provided thereto, and the first large-article operation portion 40La may be provided with a rack. Then, when the first large-article operation portion 40La is moved toward the first direction side, the rack and the pinion mesh with each other so as to move the first large-article supporting portion 31La from the large-article retracted position to the large-article supporting position, and the first large-article supporting portion 31La is held at the large-article supporting position by the meshing between the rack and the pinion. In this case, it is possible to adopt a configuration in which when the first large-article operation portion 40La is moved toward the second direction side, the meshing between the rack and the pinion is released so that the first large-article supporting portion 31La will not move from the large-article retracted position.

(6) Although the transport device is the overhead guided vehicle 1 that travels near the ceiling in the above-described embodiment, the transport device may be, for example, a floor traveling vehicle that travels on the floor surface, an elevation vehicle that moves up and down along a guide mast, or a transfer robot fixedly provided on the floor surface or the like.

(7) Although the transported article was a FOUP in the above-described embodiment, other articles such as a container with a supported portion attached to its top surface may be used as the transported article.

The invention claimed is:

1. A transport device comprising:
a pair of supporting portions that support a supported portion provided at an upper end of a transported article on both sides in a lateral width direction of the transported article;
a moving body that supports the pair of supporting portions; and
a transporting drive portion that moves the moving body,
wherein the transported article comprises a small transported article or a large transported article having a greater volume than the small transported article,
wherein a supported portion of the large transported article is formed to be wider than a supported portion of the small transported article in the lateral width direction,
a pair of large-article supporting portions that support the supported portion of the large transported article and a pair of small-article supporting portions that support the supported portion of the small transported article are separately provided as the pair of supporting portions,
the transport device includes: a large-article drive portion that moves each of the pair of large-article supporting portions between a large-article supporting position and a large-article retracted position, the large-article supporting position being a position at which an interval with an opposing large-article supporting portion in the lateral width direction is narrower than a lateral width of the supported portion of the large transported article, and the large -article retracted position being a position at which the interval with the opposing large-article supporting portion in the lateral width direction is wider than the lateral width of the supported portion of the large transported article; and
a small-article drive portion that moves each of the pair of small-article supporting portions between a small-article supporting position and a small-article retracted position, the small-article supporting position being a position at which an interval with an opposing small-article supporting portion in the lateral width direction is narrower than a lateral width of the supported portion of the small transported article, and the small-article retracted position being a position at which the interval with the opposing small-article supporting portion in the lateral width direction is wider than the lateral width of the supported portion of the small transported article and is narrower than the lateral width of the supported portion of the large transported article,
the small-article retracted position is set at a height at which the pair of small-article supporting portions are located above the supported portion of the large transported article supported by the pair of large-article supporting portions, the pair of small-article supporting portions are provided between the pair of large-article supporting portions in the lateral width direction, and the pair of small-article supporting portions include a vertical placement region having a portion overlapping a vertical placement region of the pair of large-article supporting portions.

2. The transport device according to claim 1, wherein the pair of large-article supporting portions are supported by the moving body so as to be pivotable about a large-article pivot axis extending along a front-back direction that is orthogonal to the lateral width direction, and are configured to be movable between the large-article supporting position and the large-article retracted position by being pivoted about the large-article pivot axis, and the pair of small-article supporting portions are supported by the moving body so as to be pivotable about a small-article pivot axis extending along the front-back direction, and are configured to be movable between the small-article supporting position and the small-article retracted position by being pivoted about the small-article pivot axis.

3. The transport device according to claim 2, wherein in the pair of large-article supporting portions, the large-article supporting portion located on a first direction side that is one side in the lateral width direction is used as a first large-article supporting portion, and the large-article supporting portion located on a second direction side that is a side opposite to the first direction side in the lateral width direction is used as a second large-article supporting portion, the first large-article supporting portion being pivotable about a large-article pivot axis located on the first direction side, the second large-article supporting portion being pivotable about a large-article pivot axis located on the second direction side, in the pair of small-article supporting portions, the small-article supporting portion located on the first direction side is used as a first small-article supporting portion, and the small-article supporting portion located on the second direction side is used as a second small-article supporting portion, the first small-article supporting portion being pivotable about a small-article pivot axis located on the first direction side, the second small-article supporting portion being pivotable about a small-article pivot axis located on the second direction side, and the small-article pivot axis for the first small-article supporting portion and the small-article pivot axis for the second small-article supporting portion are located between the large-article pivot axis for the first large-article supporting portion and the large-article pivot axis for the second large-article supporting portion in the lateral width direction.

4. A transport device comprising:

a pair of supporting portions that support a supported portion provided at an upper end of a transported article on both sides in a lateral width direction of the transported article;

a moving body that supports the pair of supporting portions; and a transporting drive portion that moves the moving body, wherein the transported article comprises a small transported article or a large transported article having a greater volume than the small transported article, wherein a supported portion of the large transported article is formed to be wider than a supported portion of the small transported article in the lateral width direction, a pair of large-article supporting portions that support the supported portion of the large transported article and a pair of small-article supporting portions that support the supported portion of the small transported article are separately provided as the pair of supporting portions, the transport device includes: a large-article drive portion that moves each of the pair of large-article supporting portions between a large-article supporting position and a large-article retracted position, the large-article supporting position being a position at which an interval with an opposing large-article supporting portion in the lateral width direction is narrower than a lateral width of the supported portion of the large transported article, and the large-article retracted position being a position at which the interval with the opposing large-article supporting portion in the lateral width direction is wider than the lateral width of the supported portion of the large transported article; and a small-article drive portion that moves each of the pair of small-article supporting portions between a small-article supporting position and a small-article retracted position, the small-article supporting position being a position at which an interval with an opposing small-article supporting portion in the lateral width direction is narrower than a lateral width of the supported portion of the small transported article, and the small-article retracted position being a position at which the interval with the opposing small-article supporting portion in the lateral width direction is wider than the lateral width of the supported portion of the small transported article and is narrower than the lateral width of the supported portion of the large transported article, the small-article retracted position is set at a height at which the pair of small-article supporting portions are located above the supported portion of the large transported article supported by the pair of large-article supporting portions, the pair of small-article supporting portions are provided between the pair of large-article supporting portions in the lateral width direction;

the pair of large-article supporting portions are supported by the moving body so as to be pivotable about a large-article pivot axis extending along a front-back direction that is orthogonal to the lateral width direction, and is configured to be movable between the large-article supporting position and the large-article retracted position by being pivoted about the large-article pivot axis;

the pair of small-article supporting portions are supported by the moving body so as to be pivotable about a small-article pivot axis extending along the front-back direction, and are configured to be movable between the small-article supporting position and the small-article retracted position by being pivoted about the small-article pivot axis;

in the pair of large-article supporting portions, the large-article supporting portion located on a first direction side that is one side in the lateral width direction is used as a first large-article supporting portion, and the large-article supporting portion located on a second direction side that is a side opposite to the first direction side in the lateral width direction is used as a second large-article supporting portion, in the pair of small-article supporting portions, the small-article supporting portion located on the first direction side is used as a first small-article supporting portion, and the small-article supporting portion located on the second direction side is used as a second small-article supporting portion, a first operation portion that moves the first large-article supporting portion and the first small-article supporting portion, and a second operation portion that moves the second large-article supporting portion and the second small-article supporting portion are provided, the first operation portion is provided such that, in a state in which the first operation portion moves from a first reference position toward the first direction side to press a large-article operated part of the first large-article supporting portion that is located above the large-article pivot axis toward the first direction side, thereby moving the first large-article supporting portion from the large-article retracted position to the large-article supporting position, and moves from the first reference position toward the second direction side to press a small-article operated part of the first small-article supporting portion that is located below the small-article pivot axis toward the second direction side, thereby moving the first small-article supporting portion from the small-article retracted position to the small-article supporting position, at least a part of the first operation portion is located between the first large-article supporting portion and the first small-article supporting portion in the lateral width direction, the second operation portion is provided such that, in a state in which the second operation portion moves from a second reference position toward the second direction side to press a large-article operated part of the second large-article supporting portion that is located above the large-article pivot axis toward the second direction side, thereby moving the second large-article supporting portion from the large-article retracted position to the large-article supporting position, and moves from the second reference position toward the first direction side to press a small-article operated part of the second small-article supporting portion that is located below the small-article pivot axis to the first direction side, thereby moving the second small-article supporting portion from the small-article retracted position to the small-article supporting position, at least a part of the second operation portion is located between the second large-article supporting portion and the second small-article supporting portion in the lateral width direction, a linking portion is provided that links the first operation portion and the second operation portion to each other so as to synchronically move the first operation portion and the second operation portion in directions opposite to each other in the lateral width direction, and a supporting drive portion that drives the linking portion is provided as the large-article drive portion and the small-article drive portion.

5. The transport device according to claim 4, comprising:
a first large-article biasing member that biases the large-article operated part of the first large-article supporting portion toward the second direction side; a second large-article biasing member that biases the large-article operated part of the second large-article supporting portion toward the first direction side; a first small-article biasing member that biases the small-article operated part of the first small-article supporting portion toward the first direction side; and a second small-article biasing member that biases the small-article operated part of the second small-article supporting portion toward the second direction side.

* * * * *